United States Patent [19]

Nakanishi et al.

[11] Patent Number: 5,225,398
[45] Date of Patent: Jul. 6, 1993

[54] METHOD FOR FORMING AN OXIDE SUPERCONDUCTING FILM HAVING DIFFERENT CRYSTAL ORIENTATION ON DIFFERENT REGIONS OF A SI SUBSTRATE

[75] Inventors: Hidenori Nakanishi; Shin-ichi Shikata; Itozaki Hideo, all of Itami, Japan

[73] Assignee: Sumitomo Electric Industries, Ltd., Osaka, Japan

[21] Appl. No.: 857,550

[22] Filed: Mar. 26, 1992

[30] Foreign Application Priority Data

Mar. 26, 1991 [JP] Japan .................................. 3-087917

[51] Int. Cl.$^5$ ......................... B05D 5/12; C23C 14/34
[52] U.S. Cl. ........................................ 505/1; 505/730; 505/702; 505/701; 505/731; 427/62; 427/63; 427/419.2; 427/419.3; 204/192.24
[58] Field of Search ................... 505/1, 730, 702, 701, 505/731; 427/62, 63, 419.2, 419.3, 314, 299; 204/192.24; 428/930

[56] References Cited

PUBLICATIONS

Harada et al, "Y–Ba–Cu–O Thin Film on Si Substrate", Jpn. J. Appl. Phys. lett. 27(8) Aug. 1988 pp. L1524–1526.

Ogale et al, "Pulsed excimer laser deposition $Y_1Ba_2Cu_3O_{7-x}$ Superconductor films on silicon with laser-deposited Y–Z$_r$O$_2$ buffer layer" Appl. Phys. lett. 57(17) Oct. 1990 pp. 1805–1807.

Myoren et al, "Crystalline Qualities and critical current densities of As–Grown $Ba_2YCu_3O_x$ thin films on silicon with buffer layers", Jpn. J. Appl. Phys. lett. 29(6) Jun. 1990 pp. L955–L957.

*Primary Examiner*—Shrive Beck
*Assistant Examiner*—Roy V. King
*Attorney, Agent, or Firm*—Kerkam, Stowell, Kondracki & Clarke

[57] ABSTRACT

A [100] oriented $ZrO_2$ thin film is formed on selected regions of a [100] deposition surface of a silicon substrate, and a $Y_2O_3$ thin film deposited on the $ZrO_2$ thin film and exposed regions of the deposition surface of the silicon substrate. A Y-Ba-Cu type compound oxide superconducting thin is deposited on the $Y_2O_3$ thin film. The Y-Ba-Cu type compound oxide superconducting thin film positioned above the $ZrO_2$ thin film is crystal-grown in a [001] orientation, and the Y-Ba-Cu type compound oxide superconducting thin film is crystal-grown in a [110] orientation in the other region.

10 Claims, 1 Drawing Sheet

4 Y-Ba-Cu COMPOUND OXIDE SUPERCONDUCTOR THIN FILM
3 Y₂O₃ THIN FILM
2 ZrO₂ THIN FILM
1 Si-SUBSTRATE

METHOD FOR FORMING AN OXIDE SUPERCONDUCTING FILM HAVING DIFFERENT CRYSTAL ORIENTATION ON DIFFERENT REGIONS OF A SI SUBSTRATE

BACKGROUND OF THE INVENTION

1. Field of the Invention

The present invention relates to a method of forming an oxide superconducting thin film, and more specifically to a novel method of forming on a silicon substrate a superconducting thin film of a Cu-oxide type compound oxide such as Y type compound oxide with high controllability of a crystal orientation.

2. Description of Related Art

Superconducting phenomenon had been considered to be phenomenon inherent to a cryogenic temperature indispensably requiring a cooling by a liquid helium. However, in 1986, Bednorz and Müller reported (La, Ba)$_2$CuO$_4$ showing a superconducting state at a temperature of 30 K. In 1987, Chu reported YBa$_2$Cu$_3$O$_y$ having a superconducting critical temperature on the order of 90 K., and in 1988, Maeda reported a so-call bismuth (Bi) type compound oxide superconducting material having a superconducting critical temperature exceeding 100 K. These compound oxide superconducting materials can obtain a superconducting with cooling using an inexpensive liquid nitrogen. As a result, possibility of actual application of the superconductor technology has become discussed and studied. In addition, at a beginning, the compound oxide superconducting material had been formed as a sintered body by a solid phase reaction process, but have now become possible to be formed in the form of a thin film. As a result, it has become gradually possible to obtain an increasing quality.

In application of the oxide superconducting thin film in a field of electronics, it is required to deposit a thin film having particularly a lined-up or uniform crystal orientation. Namely, it is known that the oxide superconducting material has remarkable crystal anisotropy in its superconducting properties. Therefore, at the time of depositing the oxide superconducting thin film, it is necessary to control the crystal orientation in accordance with application purpose of the deposited oxide superconducting thin film.

For example, in the case of utilizing the oxide superconducting thin film as a superconducting current path allowing a superconducting current to flow in parallel to the deposition surface of the substrate, it is necessary to deposit the oxide superconducting thin film having a "c-axis" of the crystal perpendicular to the deposition surface of the substrate. Namely, the oxide superconducting thin film is required to be a [001] oriented thin film. On the other hand, in the case of utilizing the oxide superconducting thin film in a stacked SIS (superconductor-insulator-superconductor) Josephson device, it is required to cause the superconducting current to flow perpendicularly to the deposition surface of the substrate. In this case, accordingly, it is necessary to deposit the oxide superconducting thin film having a "c-axis" of the crystal in parallel to the deposition surface of the substrate, namely, the oxide superconducting thin film oriented either in a [100] orientation or a [110] orientation.

On the other hand, the compound oxide superconducting material generally has a complicated crystalline structure, and only when it is deposited on a substrate of a special material under a special condition, a desired specific crystal orientation can be obtained. For example, as a substrate on which an oxide superconducting thin film is deposited, it is necessary to select a substrate material which matches in lattice with the oxide superconducting material and has less mutual diffusion to the oxide superconducting material. Specifically, a (100) plane of a MgO single crystal, and a (001) plane or a (110) plane of a SrTiO$_3$ single crystal, etc. can be used.

However, the above mentioned oxide single crystal substrate is generally high in cost and little in the amount of supply. Therefore, this is one demerit for actual application of the oxide superconductor. In addition, a large size of oxide single crystal substrate is very difficult to obtain, and therefore, cannot be said to be a suitable material if an inclination of a large scale of the oxide superconducting thin film is considered. Under these circumstances, it has been proposed to use, as a substrate for formation of the oxide superconducting thin film, a silicon wafer which are an inexpensive and high quality substrate material most stably available at present.

However, if the silicon substrate is used as a substrate for formation of the oxide superconducting thin film, the oxide superconducting thin film reacts with a silicon (Si) of the substrate material, with the result that the formed oxide superconducting thin film can have only a remarkably deteriorated superconduction property, or has lost the superconducting property.

In order to prevent the oxide superconducting thin film from reacting with the substrate material, it has also been proposed to form a buffer layer on a deposition surface of the substrate, and then to deposit the oxide superconducting thin film on the buffer layer. However, there has not yet been known a high quality buffer layer which permits control of the crystal orientation of the oxide superconducting thin film.

SUMMARY OF THE INVENTION

Accordingly, it is an object of the present invention to provide a method of forming an oxide superconducting thin film, which method has overcome the above mentioned defect of the conventional one.

Another object of the present invention is to provide a novel method of forming on a silicon substrate an oxide superconducting thin film while freely controlling its crystal orientation.

The above and other objects of the present invention are achieved in accordance with the present invention by a method of forming on a silicon substrate a Cu-oxide type compound oxide superconducting thin film composed of [001] oriented crystal regions and [110] oriented crystal regions in a mixed condition, comprising the steps of forming a [100] oriented ZrO$_2$ thin film in a selected region on a (100) deposition surface of a silicon substrate, the selected region being to be finally formed with a [001] oriented Cu-oxide type compound oxide superconducting thin film, forming a Y$_2$O$_3$ thin film on the deposition surface of the silicon substrate and the ZrO$_2$ thin film, and forming a Cu-oxide type compound oxide superconducting thin film on the Y$_2$O$_3$ thin film. The Cu-oxide type compound oxide superconducting thin film is crystal-grown in a [001] orientation above the ZrO$_2$ thin film, and the Cu-oxide type compound oxide superconducting thin film is crystal-grown in a [110] orientation on the other region. In a typical example, the Cu-oxide type compound oxide superconducting thin film is formed of a Y-Ba-Cu type compound oxide superconducting material.

In a preferred embodiment, prior to the deposition of the $ZrO_2$ thin film, the deposition surface of the silicon substrate is cleaned by a dilute hydrofluoric acid liquid, and then, the silicon substrate is heated at a temperature not less than 900° C. in a high vacuum of not higher than $10^{-6}$ Torr.

As mentioned hereinbefore, the compound oxide superconducting thin film is required to have a [110] orientation in one case and a [001] orientation in another case, dependently upon its actual application. It has already been attempted to form on the silicon substrate a compound oxide superconducting thin film having only one of these two crystal orientations. However, a method has not yet been reported for forming on the silicon substrate the compound oxide superconducting thin film having different regions having different crystal orientations, respectively.

The method in accordance with the present invention for forming an oxide superconducting thin film makes it possible to form on a silicon substrate a compound oxide superconducting thin film having different regions having different crystal orientations, by properly controlling the crystal orientation of a buffer layer on which the compound oxide superconducting thin film is directly deposited.

Specifically, on a (100) deposition surface of a silicon substrate, a $ZrO_2$ thin film is first formed in a region to be finally formed with a [001] oriented compound oxide superconducting thin film. This $ZrO_2$ thin film can be formed by depositing a $ZrO_2$ thin film to cover the whole of the deposition surface of the silicon substrate, and then patterning the deposited $ZrO_2$ thin film by for example an etching. Here, the $ZrO_2$ thin film deposited on the (100) surface of the silicon substrate is oriented in a [100] orientation.

Then, a $Y_2O_3$ thin film is deposited to cover the whole of the deposition surface of the silicon substrate partially coated with the $ZrO_2$ thin film. At this time, the $Y_2O_3$ thin film is oriented in a [100] orientation on the $ZrO_2$ thin film but in a [110] orientation in a region in which the $Y_2O_3$ thin film was deposited directly on the silicon substrate surface coated with no $ZrO_2$ thin film.

Thereafter, the compound oxide superconducting thin film is deposited on the $Y_2O_3$ thin film having different regions having different crystal orientations as mentioned above. The compound oxide superconducting thin film is crystal-grown in a [001] orientation on the [100] oriented region of the $Y_2O_3$ thin film, and the compound oxide superconducting thin film is crystal-grown in a [110] orientation on the [110] oriented region of the $Y_2O_3$ thin film. Accordingly, the compound oxide superconducting thin film is crystal-grown to be composed of different regions having different crystal orientations in accordance with the pattern of the $ZrO_2$ thin film first formed on the silicon substrate.

In the preferred embodiment, the deposition surface of the silicon substrate is cleaned prior to the deposition of the $ZrO_2$ thin film. The cleaning of the deposition surface of the silicon substrate is very advantageous, since it can remarkably increase the crystallinity of the buffer layer formed on the deposition surface of the silicon substrate, and therefore, is very effective in increasing the quality of the finally deposited compound oxide superconducting thin film and the controllability of the crystal orientation of the finally deposited compound oxide superconducting thin film.

Specifically, prior to the deposition of the $ZrO_2$ thin film, the deposition surface of the silicon substrate is cleaned by a dilute hydrofluoric (HF) acid liquid (50%), and then, the silicon substrate is heated at a temperature not less than 900° C. in a high vacuum of not greater than $10^{-6}$ Torr. With these treatment, the surface of the silicon substrate can be cleaned to an extremely high level. In other words, if the temperature and the degree of vacuum are lower than the above mentioned values, the quality and the crystal orientation of the buffer layer and the compound oxide superconducting thin film formed on the substrate are deteriorated. Namely, a satisfactory effect cannot be obtained.

The thickness of the $ZrO_2$ thin film formed for control of the crystal orientation is preferred to be in the range of 50 Å to 300 Å. If the thickness of the $ZrO_2$ thin film is smaller than 50 Å, it is not possible to prevent silicon of the silicon wafer from diffusing to the overlying layer. To the contrary, if the thickness of the $ZrO_2$ thin film is larger than 300 Å, a surface quality of the $ZrO_2$ thin film is deteriorated, and the propagation of the crystal growth, and hence, the crystal orientation is rather impeded.

In addition, the thickness of the $Y_2O_3$ thin film formed for control of the crystal orientation is preferred to be in the range of 300 Å to 1000 Å. If the thickness of the $Y_2O_3$ thin film is smaller than 300 Å, it is not possible to prevent silicon of the silicon wafer from diffusing to the overlying layer. To the contrary, if the thickness of the $Y_2O_3$ thin film is larger than 1000 Å, a surface quality of the $Y_2O_3$ thin film is deteriorated, and the propagation of the crystal growth, and hence, the crystal orientation is rather impeded.

The above and other objects, features and advantages of the present invention will be apparent from the following description of preferred embodiments of the invention with reference to the accompanying drawings.

DESCRIPTION OF THE PREFERRED EMBODIMENTS

Figure 1A:
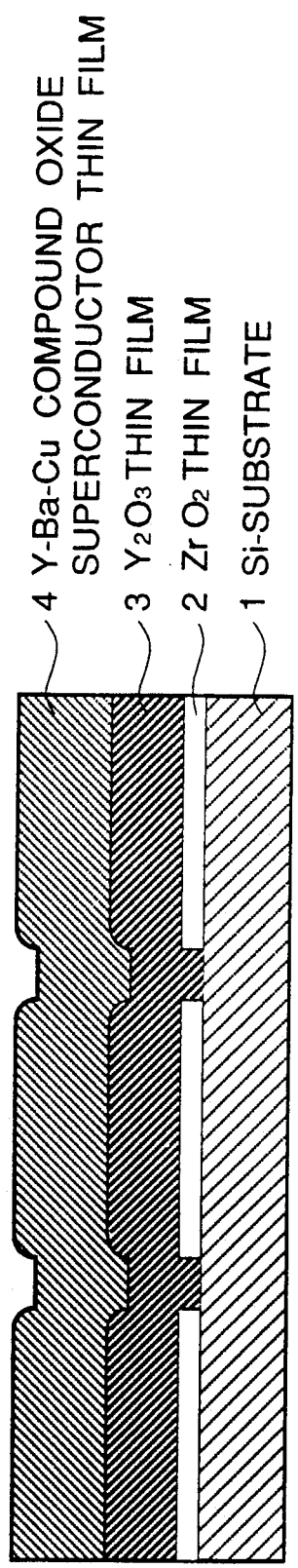
FIG. 1A is a diagrammatic sectional view of an oxide superconducting thin film formed in accordance with the method of the present invention.

In accordance with the method of the present invention, a Y-Ba-Cu type compound oxide superconducting thin film was formed on a (100) deposition surface of two silicon wafers.

One of the two silicon wafers was cleaned by a dilute hydrofluoric acid liquid of 50%, and then, maintained for 10 minutes in a furnace which is maintained at a temperature of 930° C. and which is evacuated to not greater than $10^{-6}$ Torr. The other silicon wafer was cleaned by a dilute hydrofluoric acid liquid of 50%, but not subjected to the heating treatment.

A $ZrO_2$ thin film was deposited to cover the whole of a deposition surface of the treated silicon wafer and the non-treated silicon wafer. The deposition of $ZrO_2$ was performed by a MBE (molecular beam epitaxy) process using a metal Zr as a target. The deposition condition is as follows:

| Substrate temperature | 820° C. |
| --- | --- |
| Gas pressure | $1 \times 10^{-5}$ Torr |
| Deposition speed | 0.5 Å/second |
| Film thickness | 100 Å |

Thereafter, the deposited $ZrO_2$ thin film was patterned by a reactive ion etching using a mixed gas of $CF_4$ and $H_2$ so as to remove a portion of the deposited $ZrO_2$ thin film so that a portion of the silicon substrate is exposed.

Furthermore, a $Y_2O_3$ thin film is deposited to cover all the exposed deposition surface of the silicon surface and the patterned $Y_2O_3$ thin film. The deposition of $Y_2O_3$ was performed by a MBE process using a metal Y as a target. The deposition condition is as follows:

| Substrate temperature | 720° C. |
| --- | --- |
| Gas pressure | $1 \times 10^{-5}$ Torr |
| Deposition speed | 0.2 Å/second |
| Film thickness | 300 Å |

Finally, a Y-Ba-Cu type compound oxide superconducting thin film was deposited on the deposited $Y_2O_3$ thin film by a magnetron sputtering. A target used was a compound oxide sintered body of $Y:Ba:Cu = 1.0:2.0:3.8$ in atomic ratio. The deposition condition is as follows:

| Substrate temperature | 600° C. |
| --- | --- |
| Sputtering gas | Mixed gas of Ar and $O_2$ |
| | $(O_2/Ar + O_2) = 0.2$ (volume ratio) |
| Gas pressure | 0.5 Torr |
| Deposition speed | 18 Å/minute |
| Film thickness | 1000 Å |

In the two samples thus formed, crystal orientation of a portion of the oxide superconducting thin film positioned above the $ZrO_2$ thin film and crystal orientation of the other portion of the oxide superconducting thin film were examined by an electron diffraction and an X-ray diffraction. The portion of the oxide superconducting thin film positioned above the $ZrO_2$ thin film was oriented in a [001] orientation, but the other portion of the oxide superconducting thin film was oriented in a [110] orientation.

However, in the sample which was not subjected to the cleaning treatment prior to the deposition of the $ZrO_2$ thin film, the Y-Ba-Cu type compound oxide superconducting thin film was polycrystalline in the area which was not coated with the $ZrO_2$ thin film, namely in the area in which the Y-Ba-Cu type compound oxide superconducting thin film was deposited directly on the $Y_2O_3$ thin film which was deposited directly on the silicon wafer. In addition, the crystal orientation was remarkably deteriorated.

Figure 1B:
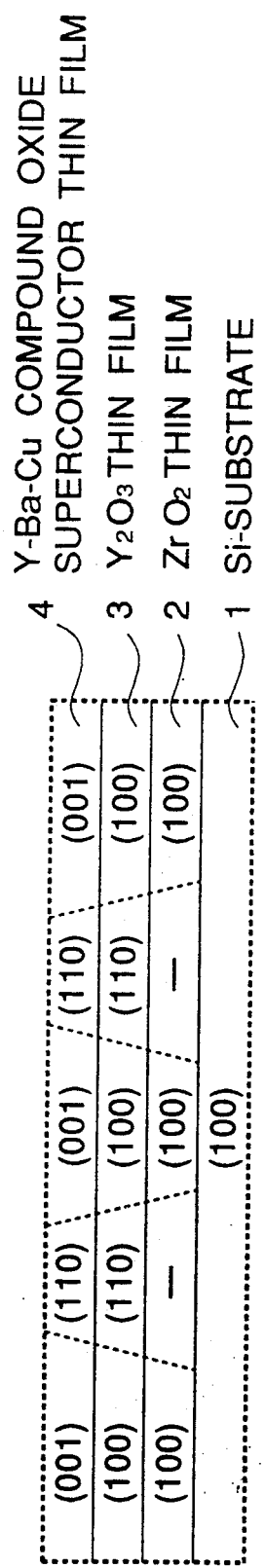
FIG. 1B illustrates the crystal orientations of the oxide superconducting thin film formed in accordance with the method of the present invention.

FIG. 1A is a diagrammatic sectional view of the oxide superconducting thin film formed in accordance with the above mentioned process, and FIG. 1B illustrates the crystal orientations of the oxide superconducting thin film formed in accordance with the above mentioned process.

As shown in FIG. 1A, the sample includes a $ZrO_2$ thin film regions 2 partially formed on a silicon substrate 1, and a $Y_2O_3$ thin film 3 and a Y-Ba-Cu type compound oxide superconducting thin film 4 deposited thereon in the named order.

The $ZrO_2$ thin film regions 2, the $Y_2O_3$ thin film 3 and the Y-Ba-Cu type compound oxide superconducting thin film 4 have the crystal orientations as shown in FIG. 1B. Specifically, the $ZrO_2$ thin film regions 2 partially formed on the silicon substrate 1 is oriented in a [100] orientation, and the $Y_2O_3$ thin film 3 is oriented in a [100] orientation directly above the $ZrO_2$ thin film regions 2 but in a [110] orientation on the other region, namely on the exposed deposition surface of silicon substrate. In addition, the Y-Ba-Cu type compound oxide superconducting thin film 4 deposited on the $Y_2O_3$ thin film 3 having the regions different in crystal orientation from each other, is oriented in a [001] orientation on the [100] oriented $Y_2O_3$ thin film regions but in a [110] orientation on the [110] oriented $Y_2O_3$ thin film regions.

For each of the two samples, a superconducting critical temperature Tc and a critical current density Jc of the [001] oriented regions and the [110] oriented regions of the Y-Ba-Cu type compound oxide superconducting thin film 4 were measured. The result of measurement is as follows: Incidentally, the critical current density Jc was measured at 77K.

| | Underlying layer for YBCO thin film | Jc (A/cm$^2$) | Tc (K) | Crystal Orientation of YBCO thin film |
| --- | --- | --- | --- | --- |
| Sample 1 | $ZrO_2/Y_2O_3$ | $8 \times 10^5$ | 89 | [001] |
| | $Y_2O_3$ | $1 \times 10^5$ | 81 | [110] |
| Sample 2 | $ZrO_2/Y_2O_3$ | $3 \times 10^5$ | 84 | [001] |
| | $Y_2O_3$ | $1 \times 10^5$ | 47 | polycrystal |

In the above mentioned embodiment, the Cu-oxide type compound oxide superconducting thin film is formed of the Y-Ba-Cu type compound oxide superconducting material, which is a typical one of a so-called high-Tc Cu-oxide type superconducting material which has been studied by many researchers since the discovery of Bednorz and Müller in 1986, and is said to indicate an oxide superconducting material having a critical temperature of not less than 30K. Therefore, it could be understood that the material of the Cu-oxide type compound oxide superconducting thin film is not limited to the Y-Ba-Cu type compound oxide superconducting material, but the Cu-oxide type compound oxide superconducting thin film can be formed of any other high-Tc Cu-oxide type superconducting material including a Bi-Sr-Ca-Cu type compound oxide superconducting material and a Tl-Ba-Ca-Cu type compound oxide superconducting material.

As will be apparent from the above description, the method of the present invention can deposit on a silicon substrate a compound oxide superconducting thin film composed of a plurality of regions adjacent to each other and having desired different crystal orientations, respectively. Therefore, if the method of the present invention is very effective in manufacturing a planar type Josephson device and a superconducting integrated circuit in which Josephson devices and superconducting wirings are assembled.

In addition, since the silicon wafer is inexpensive and stably supplied, and since there is a voluminous technical accumulation of fine patterning for the silicon, use of the silicon substrate for the formation of the oxide superconducting thin film is very effective in fabrication of various devices. Furthermore, since a large size of silicon wafer has already inexpensively been supplied, use of the silicon substrate can sufficiently comply with a coming large size inclination of the oxide superconducting thin film.

The invention has thus been shown and described with reference to the specific embodiments. However, it should be noted that the present invention is in no way limited to the details of the illustrated structures but changes and modifications may be made within the scope of the appended claims.

We claim:

1. A method for obtaining a compound oxide superconducting film having different crystal orientations in different regions of the film, the method comprising: forming, on a silicon substrate, a Cu-oxide compound oxide superconducting film composed of oriented crystal regions and oriented crystal regions, the method further comprising the steps of: forming a oriented $ZrO_2$ film in a region on a deposition surface of a silicon substrate, said $ZrO_2$ film leaving exposed at least a portion of said silicon substrate, forming a $Y_2O_3$ film on said exposed portion of said deposition surface of said silicon substrate and on said $ZrO_2$ film, then forming a Cu-oxide compound oxide superconducting film on said $Y_2O_3$ film, whereby said Cu-oxide superconducting film is grown in a orientation in a region above said $ZrO_2$ film, and whereby said Cu-oxide compound oxide superconducting film is grown in a orientation in a region which is not above said $ZrO_2$ film.

2. A method claimed in claim 1 further including, prior to said deposition of said $ZrO_2$ film, the step of cleaning said deposition surface of said silicon substrate by a dilute hydrofluoric acid liquid and heating said silicon substrate at a temperature not less than 900° C. in a high vacuum of not greater than $10^{-6}$ Torr.

3. A method claimed in claim 1 wherein said $ZrO_2$ film has a thickness in the range of 50Å to 300Å.

4. A method claimed in claim 1 wherein said $Y_2O_3$ film has a thickness in the range of 300Å to 1000Å.

5. A method claimed in claim 1 wherein said $ZrO_2$ film is formed by depositing a $ZrO_2$ film so as to cover the whole of said deposition surface of said silicon substrate, and patterning of said deposited $ZrO_2$ film into a pattern.

6. A method claimed in claim 5 wherein said deposition of said $ZrO_2$ film is performed by a MBE process using a metal Zr as a target.

7. A method claimed in claim 6 wherein said deposited $ZrO_2$ film is patterned by a reactive ion etching using a mixed gas of $CF_4$ and $H_2$.

8. A method claimed in claim 1 wherein said deposition of said $Y_2O_3$ film is performed by a MBE process using a metal Y as a target.

9. A method claimed in claim 1 wherein said Cu-oxide compound oxide superconducting film is formed by depositing a Y-Ba-Cu compound oxide superconducting material by use of a magnetron sputtering using as a target a compound oxide sintered body including Y, Ba and Cu.

10. A method for obtaining a compound oxide superconducting film having different crystal orientations in different regions of the film, the method comprising:

forming, on a (100) surface of a silicon substrate, a $ZrO_2$ film having a orientation, said $ZrO_2$ film leaving exposed at least a portion of said silicon substrate;

depositing a $Y_2O_3$ film on said $ZrO_2$ film and on said exposed portion of said silicon substrate, whereby said $Y_2O_3$ film is oriented in a orientation in a region overlying said $ZrO_2$ film and is oriented in a orientation in a region where said $Y_2O_3$ film is in contact with said exposed portion of said silicon substrate; and depositing a compound oxide superconducting film on said $Y_2O_3$ film, whereby said compound oxide superconducting film is grown in a orientation on the oriented region of said $Y_2O_3$ film, and is grown in a orientation on the oriented region of said $Y_2O_3$ film.

* * * * *